United States Patent
Maki

(10) Patent No.: US 7,061,128 B2
(45) Date of Patent: Jun. 13, 2006

(54) SEMICONDUCTOR DEVICE AND MANUFACTURING METHOD OF THE SAME

(75) Inventor: Yukio Maki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/909,975

(22) Filed: Jul. 23, 2001

(65) Prior Publication Data

US 2002/0105098 A1 Aug. 8, 2002

(30) Foreign Application Priority Data

Feb. 6, 2001 (JP) ....................................... 2001-029779

(51) Int. Cl.
- *H01L 27/11* (2006.01)
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ........................ 257/903; 257/904; 257/401; 257/368; 257/369

(58) Field of Classification Search ................ 257/903, 257/314, 368, 361, 904, 401, 369
See application file for complete search history.

(56) References Cited

U.S. PATENT DOCUMENTS

| | | | | |
|---|---|---|---|---|
| 5,135,882 A | * | 8/1992 | Karniewicz | 438/385 |
| 5,285,096 A | * | 2/1994 | Ando et al. | 257/344 |
| 5,358,890 A | * | 10/1994 | Sivan et al. | 438/450 |
| 5,455,438 A | * | 10/1995 | Hashimoto et al. | 257/391 |
| 5,592,013 A | * | 1/1997 | Honda | 257/392 |
| 5,945,715 A | * | 8/1999 | Kuriyama | 257/368 |
| 6,117,721 A | * | 9/2000 | Dennison et al. | 438/238 |
| 6,169,020 B1 | * | 1/2001 | Kim et al. | 438/399 |
| 6,707,112 B1 | * | 3/2004 | Kachelmeier | 257/368 |

FOREIGN PATENT DOCUMENTS

| | | | |
|---|---|---|---|
| JP | 1993-9059 | * | 5/1993 |
| JP | 5-198570 | | 8/1993 |
| JP | 2000-200878 A | | 7/2000 |

* cited by examiner

*Primary Examiner*—Douglas W. Owens
(74) *Attorney, Agent, or Firm*—McDermott Will & Emery LLP

(57) ABSTRACT

A semiconductor device according to the present invention includes: a semiconductor substrate including an active region and an isolation region; a gate electrode formed on the active region with an oxide film interposed therebetween; and a set of impurity regions formed on both sides of the gate electrode. A surface of the active region is entirely rounded so as to be inclined downward toward the isolation region. This rounded shape can be formed by forming an isolation oxide film such that a bird's beak portion is connected on the active region.

5 Claims, 17 Drawing Sheets

⟨ACCESS MOS TRANSISTOR PORTION⟩

⟨ACCESS MOS TRANSISTOR PORTION⟩

⟨DRIVER MOS TRANSISTOR PORTION⟩

⟨ACCESS MOS TRANSISTOR PORTION⟩

⟨DRIVER MOS TRANSISTOR PORTION⟩

⟨ACCESS MOS TRANSISTOR PORTION⟩

⟨DRIVER MOS TRANSISTOR PORTION⟩

<ACCESS MOS TRANSISTOR PORTION>

<DRIVER MOS TRANSISTOR PORTION>

⟨ACCESS MOS TRANSISTOR PORTION⟩

⟨DRIVER MOS TRANSISTOR PORTION⟩

⟨ACCESS MOS TRANSISTOR PORTION⟩

⟨DRIVER MOS TRANSISTOR PORTION⟩

⟨ACCESS MOS TRANSISTOR PORTION⟩

⟨DRIVER MOS TRANSISTOR PORTION⟩

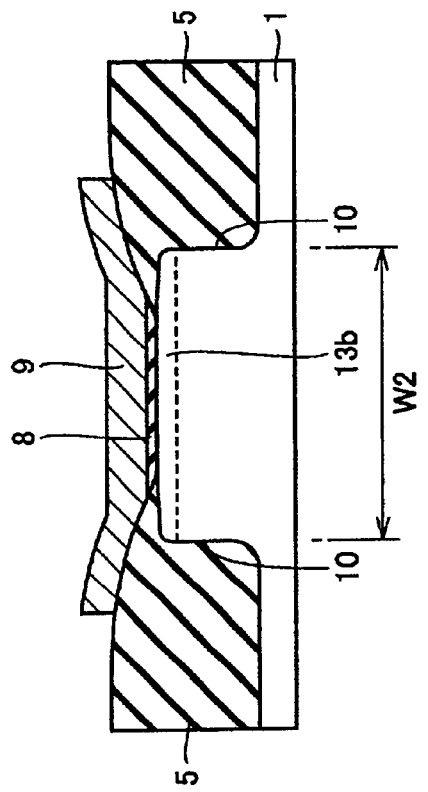
FIG.18A ⟨ACCESS MOS TRANSISTOR PORTION⟩
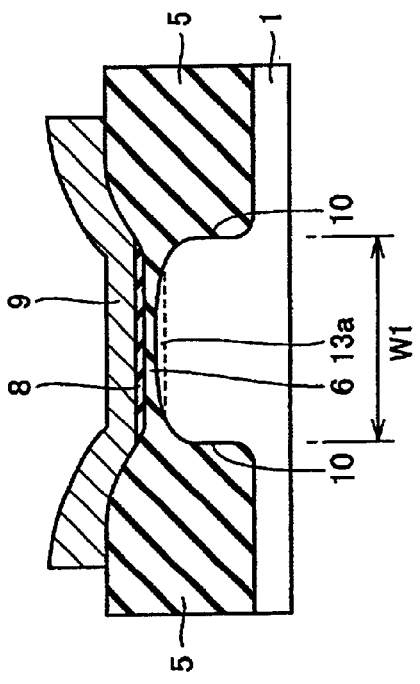
FIG.18B ⟨DRIVER MOS TRANSISTOR PORTION⟩

<ACCESS MOS TRANSISTOR PORTION>

<DRIVER MOS TRANSISTOR PORTION>

⟨ACCESS MOS TRANSISTOR PORTION⟩

⟨DRIVER MOS TRANSISTOR PORTION⟩

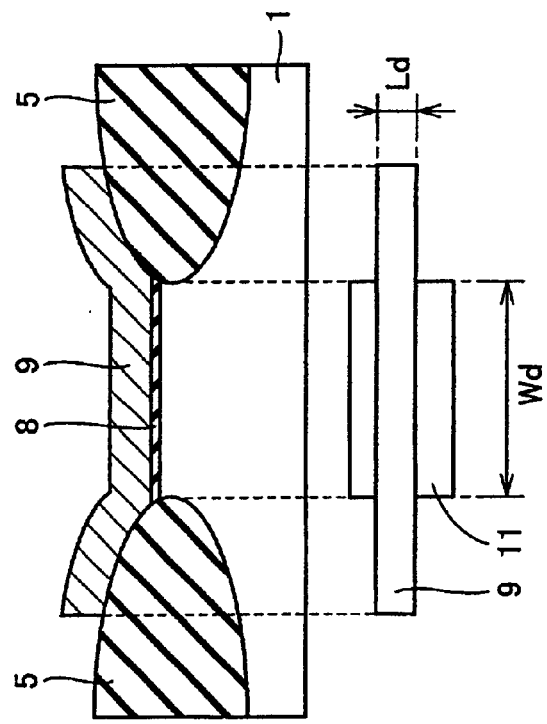
FIG.24A PRIOR ART ⟨ACCESS MOS TRANSISTOR PORTION⟩
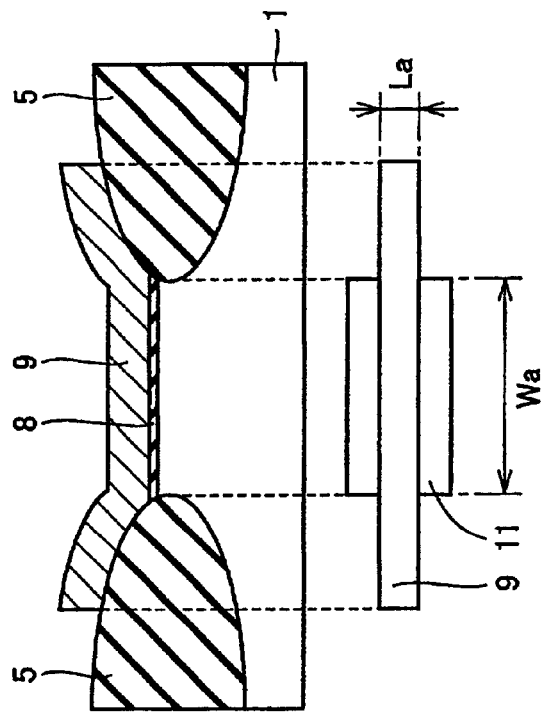
FIG.24B PRIOR ART ⟨DRIVER MOS TRANSISTOR PORTION⟩

⟨DRIVER MOS TRANSISTOR PORTION⟩

⟨ACCESS MOS TRANSISTOR PORTION⟩

⟨ACCESS MOS TRANSISTOR PORTION⟩

⟨DRIVER MOS TRANSISTOR PORTION⟩

SEMICONDUCTOR DEVICE AND MANUFACTURING METHOD OF THE SAME

BACKGROUND OF THE INVENTION

1. Field of the Invention

The present invention generally relates to a semiconductor device and a manufacturing method of the same. More particularly, the present invention relates to a semiconductor device including a MOS (Metal Oxide Semiconductor) transistor with its active region having an entirely rounded surface, and a manufacturing method of the same.

2. Description of the Background Art

FIG. 21 shows an example of the cross-sectional structure of a conventional MOS transistor. As shown in the figure, an isolation oxide film 5 is selectively formed at the main surface of a semiconductor substrate 1. A gate electrode 9 is formed on an active region 11 located between the isolation oxide films 5, with an oxide film 8 interposed therebetween.

Hereinafter, a method for manufacturing the MOS transistor of FIG. 21 will be described with reference to FIGS. 22 and 23. FIGS. 22 and 23 are cross-sectional views showing characteristic first and second steps of the manufacturing process of the aforementioned MOS transistor.

First, a mask film (not shown) is formed on the main surface of the semiconductor substrate 1. Oxidation is conducted using the mask film so as to form the isolation oxide film 5 as shown in FIG. 22. Then, as shown in FIG. 22, an oxide film 7 for preventing damage upon ion implantation is formed, and ion implantation for forming the MOS transistor is conducted.

Thereafter, as shown in FIG. 23, the oxide film 7 used in the ion implantation is removed by wet etching using HF or the like. At this time, the isolation oxide film 5 is also etched, whereby a recessed portion 12 is produced.

Then, as shown in FIG. 21, the oxide film 8 serving as a gate oxide film of the MOS transistor, and the gate electrode 9 are formed.

Hereinafter, another conventional example will be described with reference to FIGS. 24A, 24B to 26A, 26B. FIGS. 24A and 24B are cross-sectional views of an access MOS transistor portion and a driver MOS transistor portion in a memory cell of a conventional SRAM (Static Random Access Memory), respectively.

In general, the SRAM memory cell is required to have a large current ratio of the driver MOS transistor to the access MOS transistor in order to stabilize the cell operation. It is more desirable that the access MOS transistor has a smaller current value and the driver MOS transistor has a larger current value.

Accordingly, the width Wd of an active region 11 of the driver MOS transistor is larger than the width Wa of an active region 11 of the access MOS transistor, and the gate length Ld of the driver MOS transistor is shorter than the gate length La of the access MOS transistor.

The SRAM memory cell transistor is also required to have the following characteristics. It is more desirable that the access MOS transistor has a lower threshold voltage Vth upon back biasing. Moreover, because of the longer gate length of the access MOS transistor, it is preferable that the access MOS transistor is subjected to channel doping at low energy, which suppresses the back bias effect.

On the other hand, because of the shorter gate length of the driver MOS transistor, it is preferable that the driver MOS transistor is subjected to channel doping at high energy in order to suppress a punch-through.

Hereinafter, a method for manufacturing the SRAM memory cell of FIGS. 24A and 24B will be described. FIGS. 25A, 25B and FIGS. 26A, 26B are cross-sectional views showing characteristic first and second steps of the manufacturing process of the SRAM memory cell shown in FIGS. 24A and 24B.

As in the case of the aforementioned MOS transistor, a mask film is formed on the semiconductor substrate 1, and oxidation is conducted using this mask film. Thus, an isolation oxide film 5 is formed as shown in FIGS. 25A and 25B.

Then, as shown in FIGS. 25A and 25B, an oxide film 7 for preventing damage upon ion implantation is formed, and ion implantation for forming the access MOS transistor and the driver MOS transistor is conducted.

The oxide film 7 has the same thickness both in the portion where the access MOS transistor is to be formed and in the portion where the driver MOS transistor is to be formed (hereinafter, such portions are respectively referred to as access MOS transistor formation portion and driver MOS transistor formation portion).

Thereafter, as shown in FIGS. 26A and 26B, the oxide film 7 is removed by wet etching using HF or the like. Then, as shown in FIGS. 24A and 24B, an oxide film 8 serving as a gate oxide film of the access MOS transistor and the driver MOS transistor, and a gate electrode 9 are formed.

As described above, the MOS transistor of FIG. 21 has the recessed portion 12 produced at the edge of the isolation oxide film 5, which causes a leak current in the MOS transistor. This problem may also occur in the example of FIGS. 24A and 24B.

As described above, the oxide film 7 for channel implantation has the same thickness both in the access MOS transistor and the driver MOS transistor shown in FIGS. 24A and 24B. Therefore, it has been impossible to make the respective depths of the channel doping regions of the access MOS transistor and the driver MOS transistor different from each other, unless, for example, a mask film is formed to cover one of the respective regions where the access MOS transistor and the driver MOS transistor are to be formed.

Moreover, it has been impossible to make the respective thicknesses of the gate insulating films of the access MOS transistor and the driver MOS transistor different from each other without adding the step of forming an insulating film.

In other words, it has been difficult to improve the memory cell performance of the SRAM as well as stabilize the memory cell operation thereof without conducting any additional step.

SUMMARY OF THE INVENTION

The present invention is made to solve the aforementioned problems. It is an object of the present invention to reduce a leak current of a semiconductor device including a MOS transistor. It is another object of the present invention to improve the memory cell performance of the SRAM as well as stabilize the memory cell operation thereof without requiring any additional step.

A semiconductor device according to the present invention includes: a semiconductor substrate including an active region and an isolation region; and a gate electrode formed on the active region with an insulating film interposed therebetween. A surface of the active region is entirely rounded so as to be inclined downward toward the isolation region.

The surface of the active region having such a shape allows the insulating film to have an increased thickness near the edge of the isolation region. Accordingly, a recessed portion as in the conventional example can be prevented from being produced at the edge of the isolation region.

The semiconductor device includes an SRAM, and the SRAM includes an access MOS transistor and a driver MOS transistor. In this case, the surface of the active region of the access MOS transistor is entirely rounded.

Accordingly, a leak current in the access MOS transistor can be suppressed.

An isolation insulating film is formed in the isolation region. The isolation insulating film includes a bird's beak portion extending on the active region. In this case, the active region is covered with the bird's beak portion.

This allows the insulating film to have an increased thickness at the edge of the isolation region. Accordingly, a recessed portion as in the conventional example can be prevented from being produced at the edge of the isolation region.

The bird's beak portion has a larger thickness near the isolation region than in a center of the active region.

Accordingly, the recessed portion can be effectively prevented from being produced at the edge of the isolation region.

In the SRAM, the access MOS transistor preferably has a smaller channel doping depth than that of the driver MOS transistor.

Accordingly, a punch-through in the driver MOS transistor can be suppressed while suppressing the back bias effect of the access MOS transistor, whereby the memory cell performance can be improved.

A gate insulating film of the access MOS transistor preferably has a larger thickness than that of a gate insulating film of the driver MOS transistor.

This enables the current amount of the access MOS transistor to be reduced, whereby the memory cell operation can be stabilized.

A method for manufacturing a semiconductor device according to the present invention includes, in one aspect, the steps of: forming a mask film on a semiconductor substrate so as to expose an isolation region of the semiconductor substrate as well as to cover an active region thereof; selectively oxidizing the semiconductor substrate using the mask film, so as to form a bird's beak portion covering the active region; removing the mask film and then forming a first insulating film on the bird's beak portion; implanting impurities into the active region through the first insulating film and the bird's beak portion; and removing the first insulating film and then forming a gate electrode on the active region with a second insulating film interposed therebetween.

Forming the first insulating film on the bird's beak portion allows the thick insulating film to be present at the edge of the isolation region upon removing the first insulating film. Accordingly, a recessed portion can be prevented from being produced at the edge of the isolation region after removing the first insulating film.

The step of forming the bird's beak portion includes the step of forming the bird's beak portion such that a surface of the active region is entirely rounded by connecting the bird's beak portion on the active region. This ensures that the thick insulating film is present at the edge of the isolation region upon removing the first insulating film, whereby a recessed portion can be effectively prevented from being produced.

A method for manufacturing a semiconductor device including an access MOS transistor and a driver MOS transistor according to the present invention includes, in another aspect, the steps of: forming first and second mask films on a semiconductor substrate so as to expose an isolation region of the semiconductor substrate as well as to respectively cover a first active region where the access MOS transistor is to be formed and a second active region where the driver MOS transistor is to be formed; selectively oxidizing the semiconductor substrate using the first and second mask films, so as to form a bird's beak portion entirely covering the first active region and covering only a peripheral portion of the second active region; removing the first and second mask films and then forming first and second insulating films on the first and second active regions, respectively; implanting impurities into the first active region through the first insulating film and the bird's beak portion as well as implanting the impurities into the second active region through the second insulating film; and removing the first and second insulating films and then forming first and second gate electrodes on the first and second active regions with third and fourth insulating films interposed therebetween, respectively.

Covering the first active region entirely with the bird's beak portion enables the insulating film on the first active region to have a larger thickness than that of the insulating film on the second active region after forming the first and second insulating films on the first and second active regions, respectively. Channel doping is conducted through such underlying insulating films. The underlying insulating film on the first active region for channel doping can be made to have a larger thickness than that of the underlying insulating film on the second active region. Accordingly, a channel doping depth of the first active region can be made smaller than that of the second active region. In other words, the channel doping depth of the access MOS transistor can be made smaller than that of the driver MOS transistor. This is realized by merely connecting the bird's beak portion on the first active region, requiring no additional step.

The step of forming the bird's beak portion preferably includes the step of forming the bird's beak portion such that a surface of the first active region is entirely rounded by connecting the bird's beak portion on the first active region.

Accordingly, a recessed portion can be prevented from being produced at the edge of the isolation region around the access MOS transistor.

The step of removing the first and second insulating films includes the step of leaving the bird's beak portion on the first active region while exposing a surface of the second active region.

This allows a gate insulating film of the access MOS transistor to have a substantially larger thickness than that of a gate insulating film of the driver MOS transistor. Accordingly, a current value of the access MOS transistor can be reduced, whereby the memory cell operation can be stabilized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A, 12B to 17A, 17B are cross-sectional views respectively showing first to sixth steps of a manufacturing process of the semiconductor device shown in FIGS. 11A and 11B.

FIGS. 18A and 18B are cross-sectional views of a modification of the semiconductor device shown in FIGS. 11A and 11B.

FIGS. 24A and 24B are cross-sectional views of another example of the conventional semiconductor device.

DESCRIPTION OF THE PREFERRED EMBODIMENTS

Hereinafter, embodiments of the present invention will be described with reference to FIGS. 1 to 20A, 20B.

First Embodiment

Figure 1:
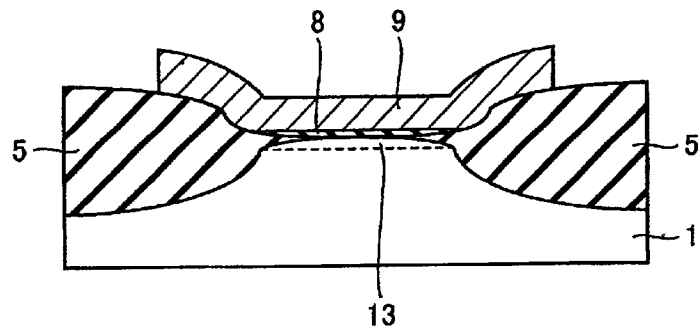
FIG. 1 is a cross-sectional view of a semiconductor device according to a first embodiment of the present invention.

FIG. 1 is a cross-sectional view of a MOS transistor portion of a semiconductor device according to the first embodiment of the present invention. As shown in FIG. 1, the MOS transistor of the present embodiment is formed on an active region surrounded by an isolation region that is selectively provided at the main surface of a semiconductor substrate 1.

An isolation insulating film such as an isolation oxide film 5 is formed in the isolation region. The isolation oxide film 5 is formed by, e.g., a LOCOS (Local Oxidation of Silicon) method described below, and has a bird's beak portion extending on the active region. Although the bird's beak portion does not cover the active region in the example shown in FIG. 1, the active region may alternatively be covered therewith.

As shown in FIG. 1, a recessed portion as produced in the conventional example does not exist at the edge of the isolation oxide film 5, but the oxide film (insulating film) has an increased thickness near the edge of the isolation oxide film 5. This allows for suppression of a leak current in the MOS transistor.

The surface of the active region located between the isolation oxide films 5 is entirely rounded in an upward-projecting manner so as to be inclined downward toward the isolation region. Preferably, the surface of the active region is curved with a prescribed curvature from its center toward peripheral portion so as to be gradually inclined downward from the center toward peripheral portion. Such a surface structure of the active region also contributes to the increased thickness of the oxide film at the edge of the isolation region.

A channel doping region 13 is formed at the surface of the active region, and a gate electrode 9 is formed on the active region with an oxide film 8 interposed therebetween. A set of impurity regions (not shown) serving as source/drain regions is formed on both sides of the gate electrode 9.

Hereinafter, a method for manufacturing the semiconductor device according to the present embodiment will be described with reference to FIGS. 2 to 7. FIGS. 2 to 7 are cross-sectional views respectively showing first to sixth steps of a manufacturing process of the semiconductor device according to the present embodiment.

Figure 2:
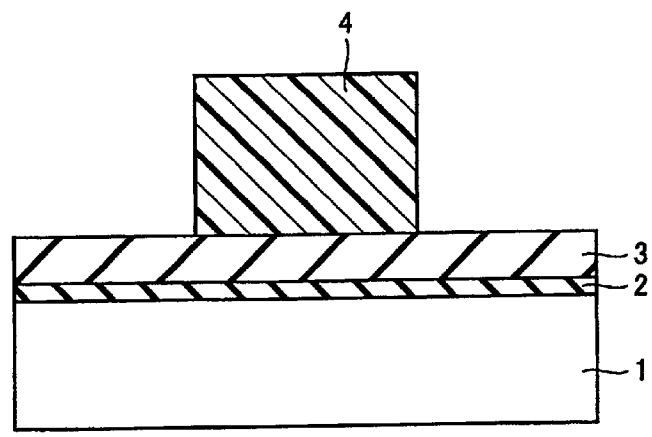
FIGS. 2 to 7 are cross-sectional views respectively showing first to sixth steps of a manufacturing process of the semiconductor device shown in FIG. 1.

As shown in FIG. 2, a buffer film 2 formed from a silicon oxide film, silicon oxynitride film, polysilicon film or the like is formed on the main surface of the semiconductor substrate 1 by a CVD (Chemical Vapor Deposition) method or the like. A nitride film 3 is formed on the buffer film 2 by the CVD method or the like. A resist pattern 4 is formed on the nitride film 3.

Figure 3:
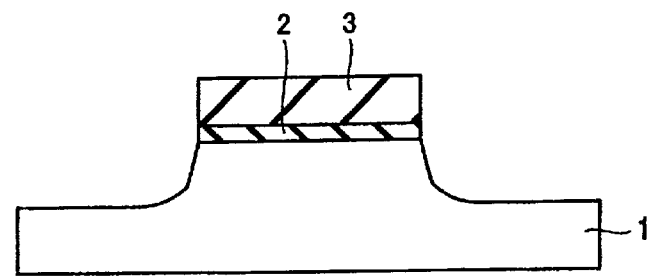

Then, the nitride film 3 and the buffer film 2 are etched with the resist pattern 4. This enables the stacked film (mask film) of the nitride film 3 and the buffer film 2 to be left on the active region, as shown in FIG. 3. At this time, the main surface of the semiconductor substrate 1 is slightly recessed due to over-etching. Thereafter, the resist pattern 4 is removed.

Figure 4:
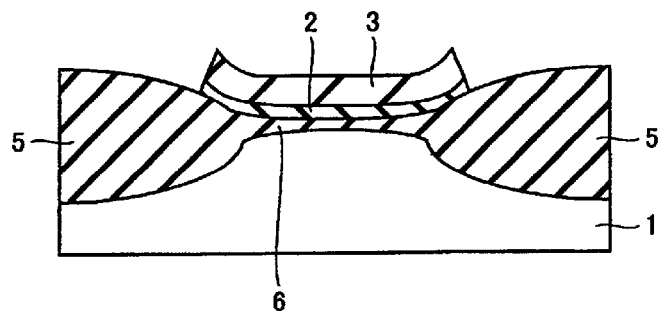

The semiconductor substrate 1 is then selectively thermally oxidized using the nitride film 3 and the buffer film 2 as a mask, whereby the isolation oxide film 5 is formed as shown in FIG. 4.

At this time, it is possible to adjust the length of the bird's beak portion 6 of the isolation oxide film 5 by adjusting the material and thickness of the buffer film 2 and the thickness of the nitride film 3. Therefore, the bird's beak portion 6 can be connected on the active region, so that the active region can be covered with the bird's beak 6, as shown in FIG. 4.

For example, when field oxidation is conducted in $H_2$, $O_2$ gas at 1050° C. with a thickness of about 400 nm or less, the bird's beak portion 6 can be formed with a length of 0.25 µm. Accordingly, provided that the active region has a width of 0.5 µm or less (the active region has a width equal to or smaller than twice the length of the bird's beak portion 6), the bird's beak portion 6 can be connected on the active region.

Note that the buffer film 2 in the field oxidation is formed from a silicon oxynitride film (SION), and the thickness thereof is about 10 nm. The thickness of the nitride film 3 is about 63 nm.

As shown in FIG. 4, the bird's beak portion 6 has a larger thickness near the isolation region than in the center of the active region, and the surface of the active region is entirely rounded. This allows the oxide film (insulating film) to have an increased thickness at the edge of the isolation region.

Figure 5:
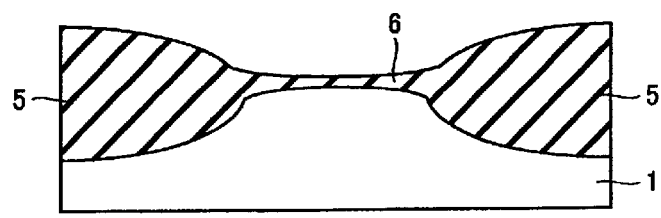
Figure 6:
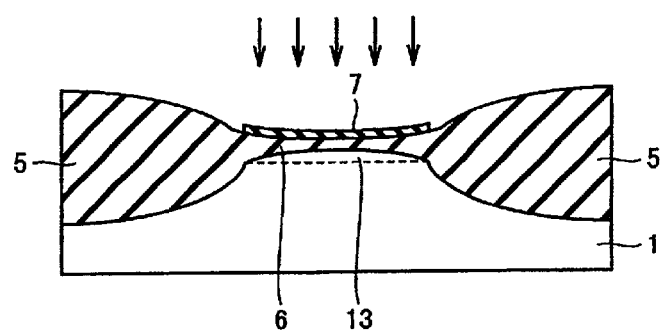

After the nitride film 3 and the buffer film 2 are removed by etching or the like as shown in FIG. 5, an oxide film 7 for preventing damage upon ion implantation is formed on the bird's beak portion 6 as shown in FIG. 6. Then, prescribed impurities are implanted into the active region through the oxide film 7 and the bird's beak portion 6 in order to conduct channel doping for forming the MOS transistor. Thus, the channel doping region 13 is formed.

Figure 7:
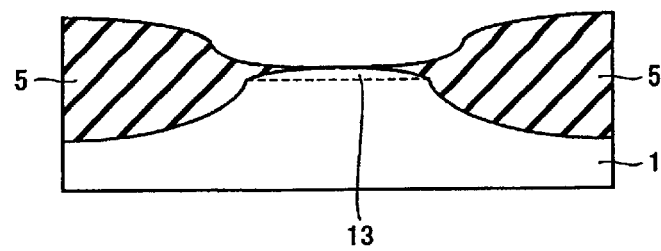

As shown in FIG. 7, the oxide film 7 is then removed by wet etching using HF or the like. As described above, the oxide film has an increased thickness at the edge of the isolation region. Accordingly, a recessed portion as in the conventional example can be prevented from being produced at the edge of the isolation region.

Thereafter, the oxide film 8 serving as a gate oxide film of the MOS transistor, and the gate electrode 9 are formed by a CVD method or the like, whereby the structure shown in FIG. 1 is obtained.

Figure 8:
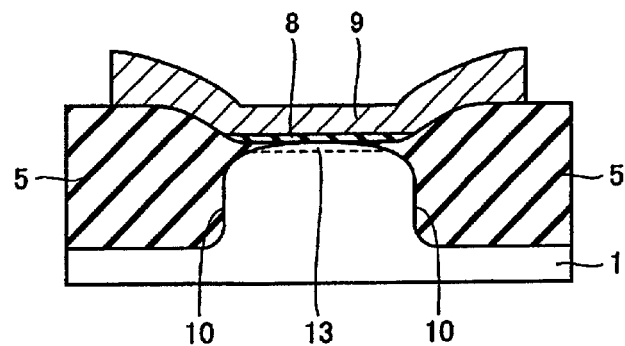
FIG. 8 is a cross-sectional view of a modification of the semiconductor device of FIG. 1.
Figure 9:
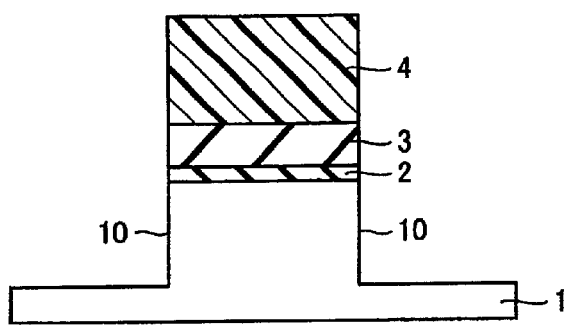
FIGS. 9 and 10 are cross-sectional views respectively showing characteristic first and second steps of a manufacturing process of the semiconductor device shown in FIG. 8.
Figure 10:
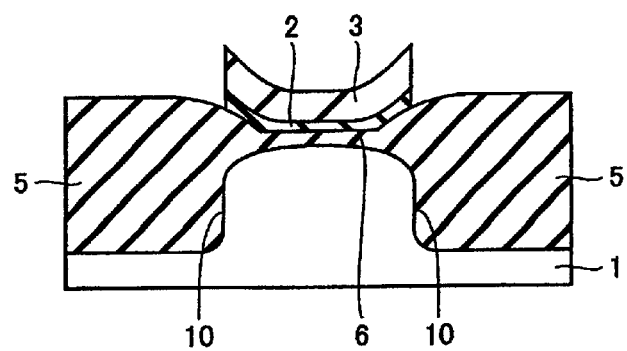

Hereinafter, a modification of the first embodiment will be described with reference to FIGS. 8 to 10. FIG. 8 is a cross-sectional view of a MOS transistor portion according to the modification.

Although the present invention is applied to the LOCOS-type isolation in the first embodiment, the idea of the present invention is also applicable to trench-type isolation.

As shown in FIG. 8, in this modification, trenches 10 are formed at the main surface of the semiconductor substrate 1, so that the isolation oxide film 5 is formed in the trenches 10. Since the structure of the modification is otherwise substantially the same as that of the first embodiment, description thereof is omitted. Note that, although the bird's beak portion 6 is disconnected on the active region also in this modification shown in FIG. 8, it may alternatively be connected on the active region.

A manufacturing method of the modification will now be described with reference to FIGS. 9 and 10. FIGS. 9 and 10 are cross-sectional views respectively showing characteristic first and second steps of the manufacturing process of this modification.

By conducting the same steps as those of the first embodiment, a buffer film 2, a nitride film 3 and a resist pattern 4 are formed on the main surface of the semiconductor substrate 1, and the buffer film 2 and the nitride film 3 are patterned using the resist pattern 4 as a mask. Thereafter, the semiconductor substrate 1 is further etched, forming the trenches 10 as shown in FIG. 9.

Then, the resist pattern 4 is removed, and selective oxidation is conducted using the buffer film 2 and the nitride film 3 as a mask, so that the bird's beak portion 6 is connected on the active region. Thereafter, an oxide film is deposited and polished by a CMP (Chemical Mechanical Polishing) method or the like. Thus, the trenches 10 can be filled with the oxide film, as shown in FIG. 10.

The subsequent steps are the same as those of the first embodiment, whereby the structure shown in FIG. 8 is obtained.

Second Embodiment

Figure 11A:
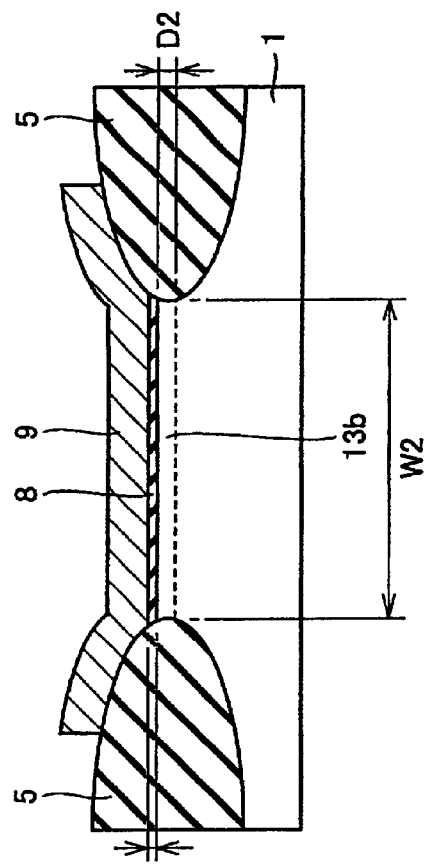
FIGS. 11A and 11B are cross-sectional views of a semiconductor device according to a second embodiment of the present invention.
Figure 11B:
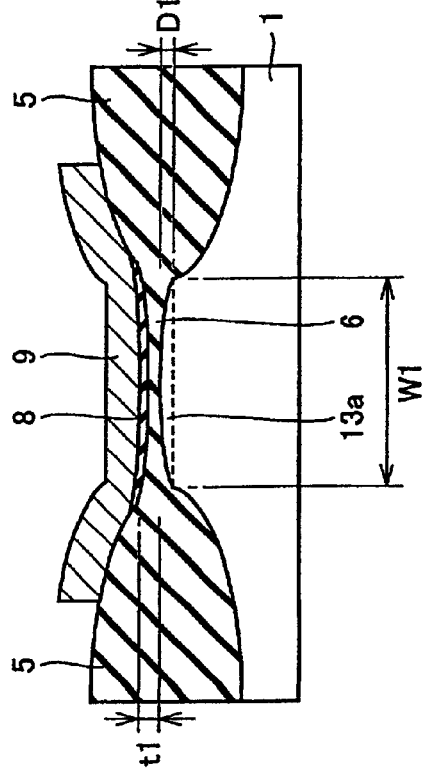

Hereinafter, the second embodiment of the present invention will be described with reference to FIGS. 11A, 11B to 20A, 20B. FIGS. 11A and 11B are cross-sectional view respectively showing an access MOS transistor portion and a driver MOS transistor portion in the semiconductor device of the second embodiment.

In the second embodiment, the present invention is applied to an SRAM. The SRAM includes an access MOS transistor and a driver MOS transistor as shown in FIGS. 11A and 11B. The surface of an active region of the access MOS transistor formation portion (hereinafter, this active region is referred to as "first active region") is entirely rounded in an upward-projecting manner, as in the case of the first embodiment.

This enables the oxide film to have an increased thickness at the edge of the isolation region, whereby a recessed portion can be prevented from being produced at the edge of the isolation region, as in the case of the first embodiment. Thus, a leak current in the access MOS transistor can be suppressed.

The depth D1 of a channel doping region 13a of the access MOS transistor is made smaller than the depth D2 of a channel doping region 13b of the driver MOS transistor.

Thus, a punch-through in the driver MOS transistor can be suppressed while suppressing the back bias effect of the access MOS transistor. As a result, improved memory cell performance can be achieved.

Moreover, the thickness t1 of the gate insulating film (the stacked film of the oxide film 8 and the bird's beak portion 6) of the access MOS transistor is made larger than the thickness t2 of the gate insulating film (the oxide film 8) of the driver MOS transistor. Thus, the current amount of the access MOS transistor can be reduced, allowing for stabilized memory cell operation.

Moreover, the width W1 of the first active region is made smaller than the width W2 of an active region of the driver MOS transistor formation portion (hereinafter, such an active region is referred to as "second active region").

Accordingly, the current ratio of the driver MOS transistor to the access MOS transistor is increased, thereby stabilizing the memory cell operation. Moreover, the bird's beak portion 6 can be separated on the second active region while being connected on the first active region.

A method for manufacturing the semiconductor device according to the second embodiment will now be described with reference to FIGS. 12A, 12B to 17A, 17B. FIGS. 12A, 12B to 17A, 17B are cross-sectional views respectively showing first to sixth steps of the manufacturing process of the semiconductor device according to the second embodiment.

Figure 12A:
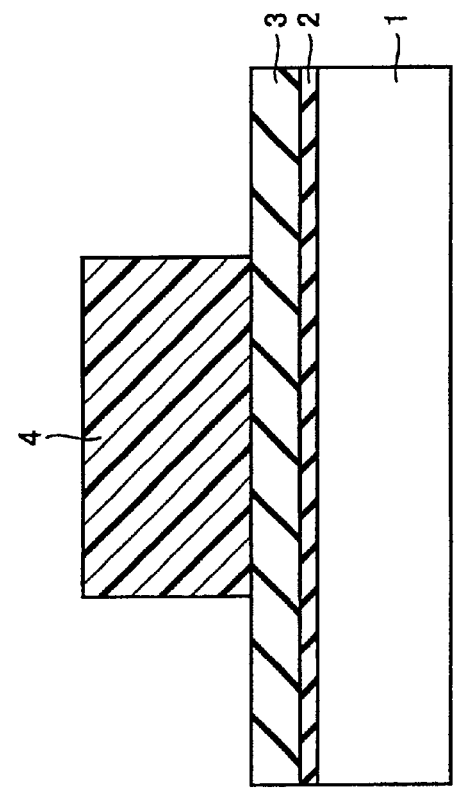
Figure 12B:
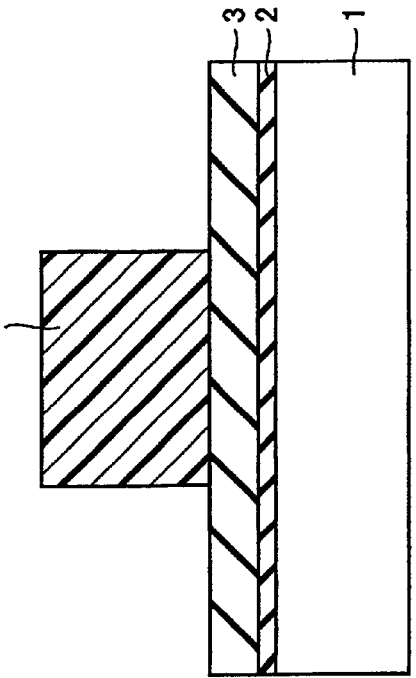

As shown in FIGS. 12A, 12B, a buffer film 2 formed from a silicon oxide film, silicon oxynitride film, polysilicon film or the like is formed on the main surface of the semiconductor substrate 1 by a CVD method or the like. A nitride film 3 is formed on the buffer film 2 by the CVD method or the like. A resist pattern 4 is formed on the respective portions of the nitride film 3 corresponding to the first and second active regions.

Figure 13A:
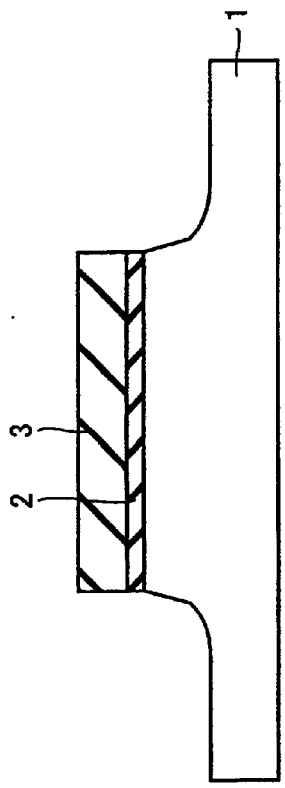
Figure 13B:
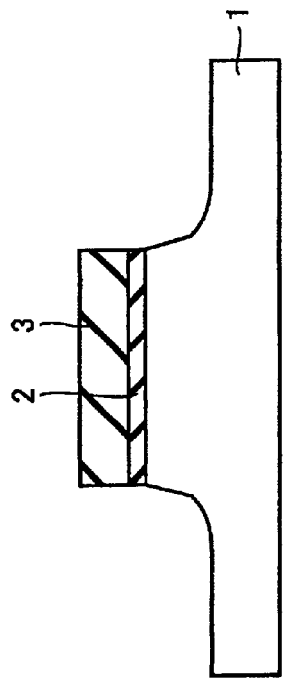

Then, the nitride film 3 and the buffer film 2 are etched with the resist pattern 4. This enables the stacked films (first and second mask films) of the nitride film 3 and the buffer film 2 to be left on the first and second active region, respectively, as shown in FIGS. 13A and 13B. At this time, the main surface of the semiconductor substrate 1 is slightly recessed due to over-etching. Thereafter, the resist pattern 4 is removed.

Figure 14A:
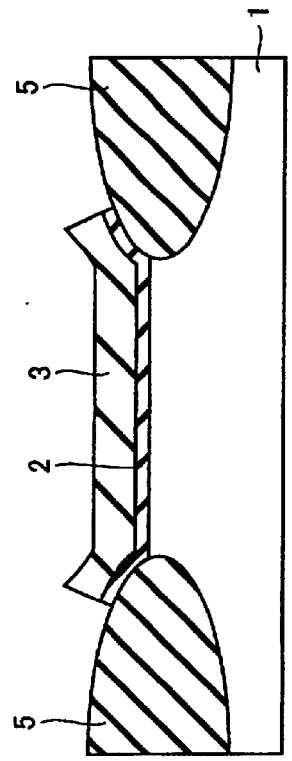
Figure 14B:
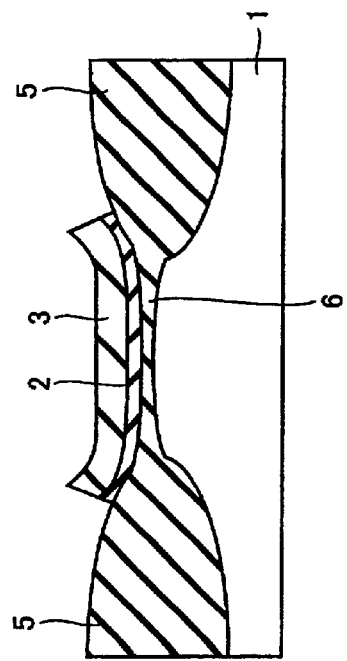

The semiconductor substrate 1 is then selectively thermally oxidized using the nitride film 3 and the buffer film 2 as a mask, whereby an isolation oxide film 5 is formed around each of the first and second active regions, as shown in FIGS. 14A and 14B.

As described above, the width W1 of the first active region is made smaller than the width W2 of the second active region. Thus, the bird's beak portion 6 can be connected on the first active region while being separated on the second active region. In other words, the first active region is entirely covered with the bird's beak portion 6, while the second active region is covered therewith only in its peripheral portion.

For example, when field oxidation is conducted under the same conditions as those of the first embodiment with a thickness of about 400 nm or less, the width W1 of the first active region is set to about 0.5 μm or less, and the width W2 of the second active region is set to about 0.7 μm or more. Thus, the bird's beak portion 6 can be connected on the first active region while being separated on the second active region.

The first active region is entirely covered with the bird's beak portion 6 as described above, whereby the surface of the first active region is entirely rounded as shown in FIG. 14A.

Figure 15A:
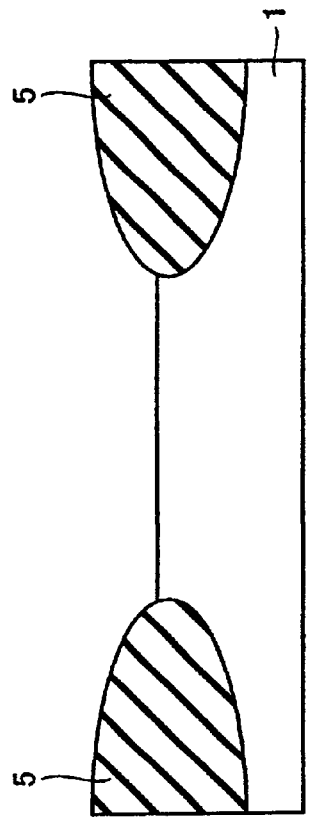
Figure 15B:
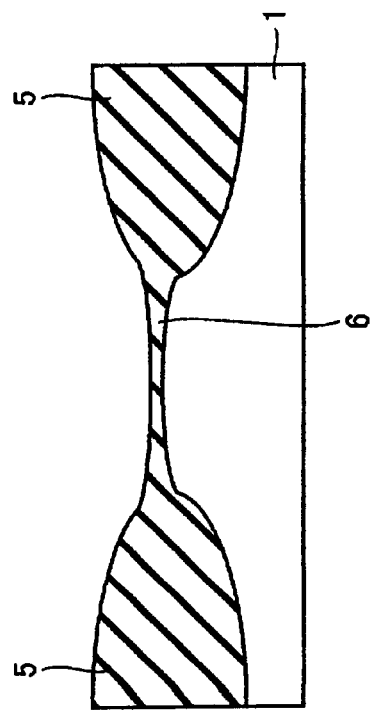

As shown in FIGS. 15A and 15B, the nitride film 3 and the buffer film 2 are then removed by etching or the like. At this time, the first active region is covered with the bird's beak portion 6, whereas the second active region is exposed.

Figure 16A:
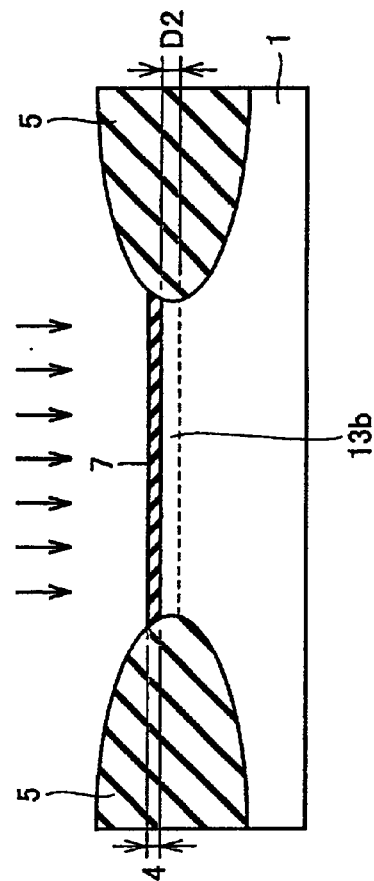
Figure 16B:
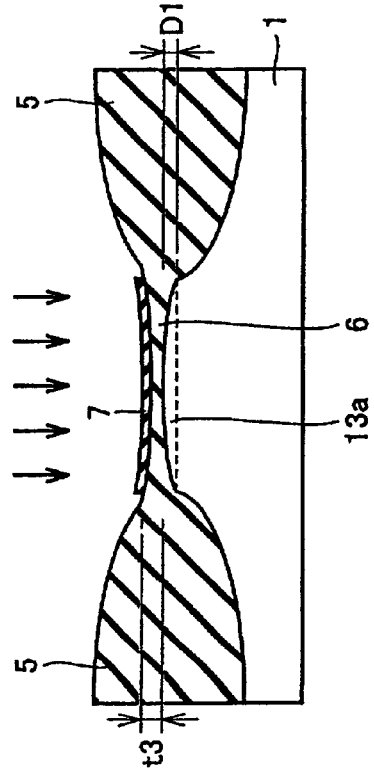

As shown in FIGS. 16A and 16B, an oxide film 7 for preventing damage upon ion implantation is formed on the bird's beak portion 6 and the second active region. Then, prescribed impurities are implanted into each active region in order to conduct channel doping for forming the access MOS transistor and the driver MOS transistor.

At this time, impurities are implanted into the first active region through the oxide film 7 and the bird's beak portion 6, and into the second active region through the oxide film 7. The total thickness t3 of the oxide film 7 and the bird's beak portion 6 is, e.g., about 30 nm, which is larger than the thickness t4 (e.g., about 15 nm) of the oxide film 7 on the second active region. Therefore, the channel doping can be conducted deeply into the second active region, while being conducted less deeply into the first active region.

Thus, the depth D1 (e.g., about 130 nm) of the channel doping region 13a of the access MOS transistor can be made smaller than the depth D2 (e.g., about 145 nm) of the channel doping region 13b of the driver MOS transistor.

Since the bird's beak portion 6 need only be left on the first active region, no additional step is required.

Figure 17A:
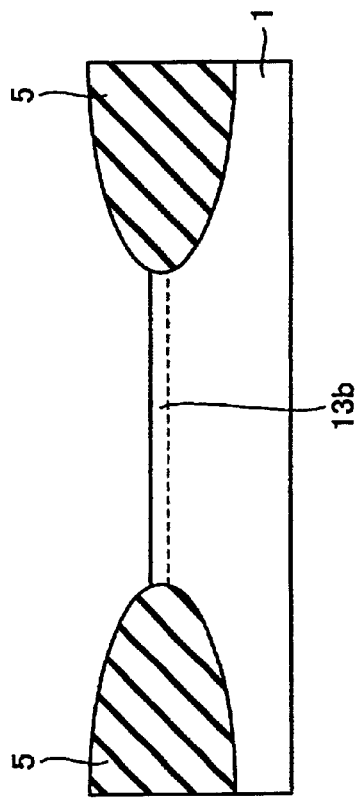
Figure 17B:
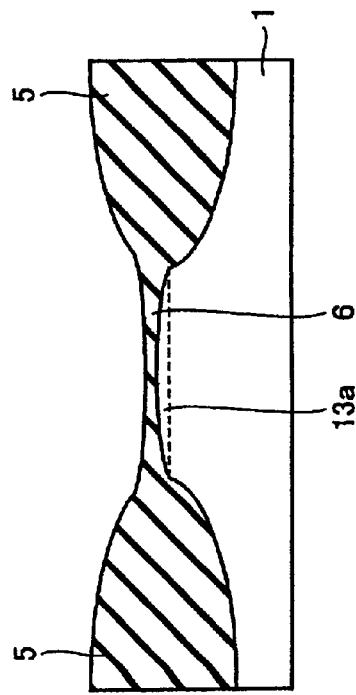

Then, as shown in FIGS. 17A and 17B, the oxide film 7 is removed by wet etching using HF or the like. The access MOS transistor formation portion has the thick bird's beak portion 6 under the oxide film 7. Therefore, it is possible to remove the oxide film 7 on the second active region while leaving the bird's beak portion 6 on the first active region after the wet etching.

Moreover, since the isolation oxide film 5 has an increased thickness at the edge of the isolation region of the access MOS transistor, a recessed portion can be prevented from being produced at the edge of the isolation region of the access MOS transistor.

Then, an oxide film 8 serving as a gate oxide film of each MOS transistor, and a gate electrode 9 are formed by a CVD method or the like, whereby the structure shown in FIGS. 11A and 11B is obtained. Since the bird's beak portion 6 is present on the first active region before the oxide film 8 is formed, the thickness of the gate oxide film of the access MOS transistor can be made larger than that of the gate oxide film of the driver MOS transistor.

Note that the idea of the present embodiment is also applicable to the trench isolation. FIGS. 18A and 18B show the structure of a modification of the second embodiment applied to the trench isolation.

As shown in FIGS. 18A and 18B, in this modification, the isolation oxide film 5 is formed in the trenches 10. Since the structure of the modification is otherwise substantially the same as that shown in FIGS. 11A and 11B, description thereof is omitted. The same effects as those of the second embodiment can be obtained by this modification.

A manufacturing method of the modification will now be described with reference to FIGS. 19A, 19B and 20A, 20B.

Figure 19A:
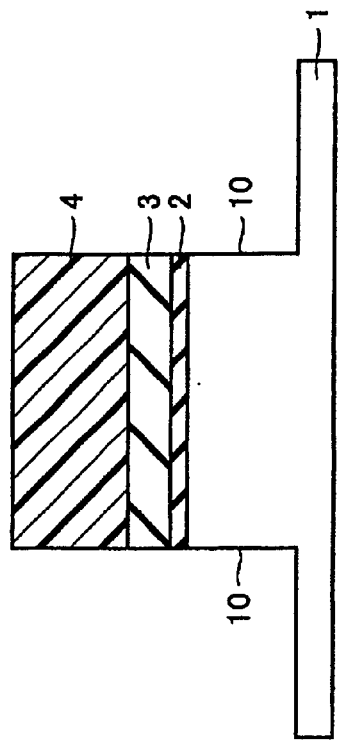
FIGS. 19A, 19B and 20A, 20B are cross-sectional views respectively showing characteristic first and second steps of a manufacturing process of the semiconductor device shown in FIGS. 18A and 18B.
Figure 19B:
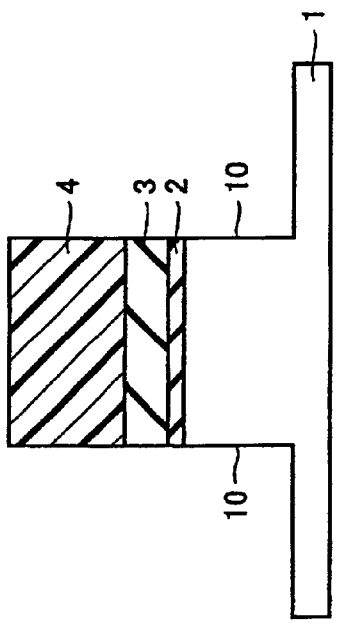

By conducting the same steps as those of the second embodiment, a buffer film 2, a nitride film 3 and a resist pattern 4 are formed on the main surface of the semiconductor substrate 1, as shown in FIGS. 19A and 19B. The nitride film 3 and the buffer film 2 are patterned using the resist pattern 4. Thereafter, the semiconductor substrate 1 is further etched, forming the trenches 10 in the isolation region as shown in FIGS. 19A and 19B.

Figure 20A:
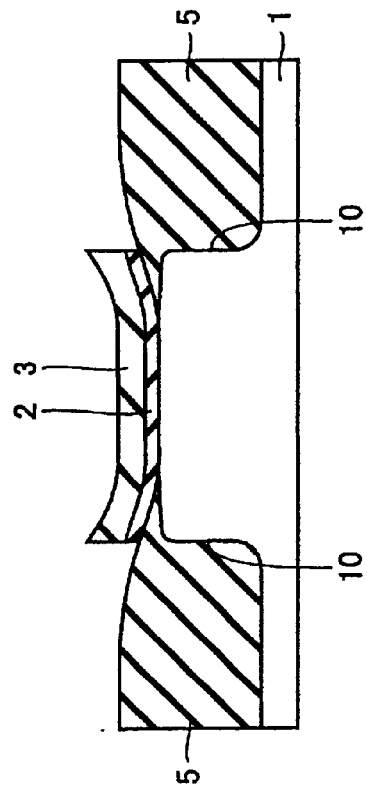
Figure 20B:
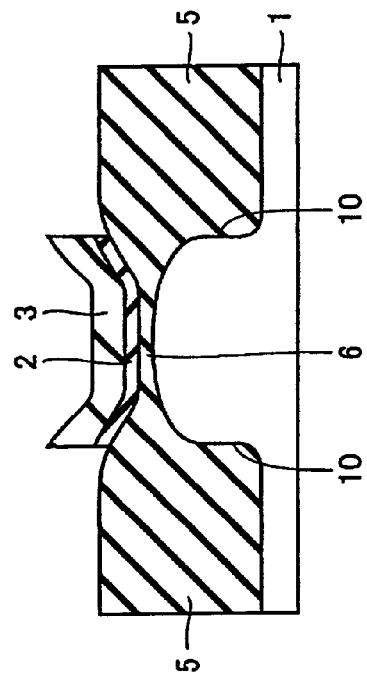
Figure 21:
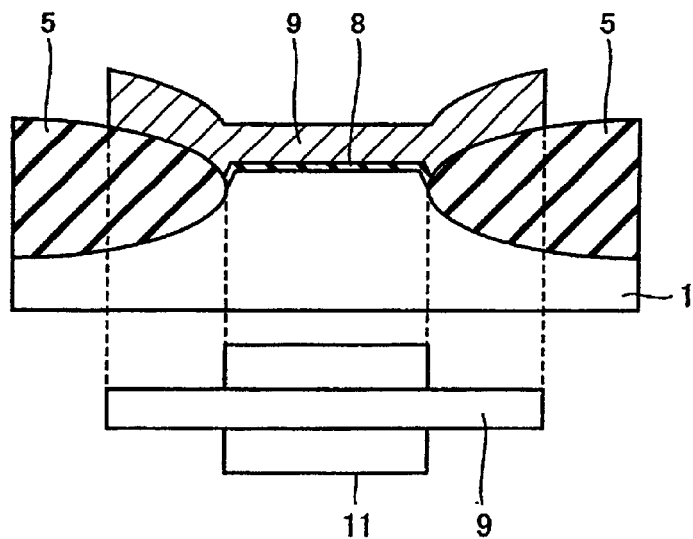
FIG. 21 is a cross-sectional view of a conventional semiconductor device.
Figure 22:
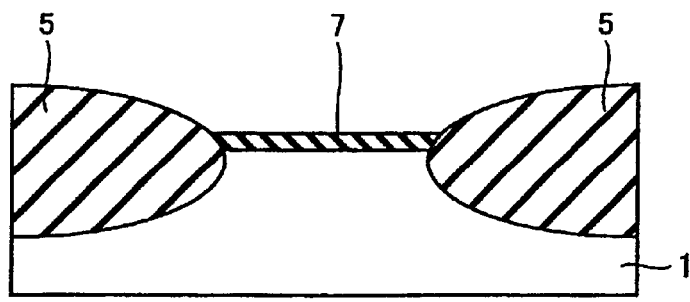
FIGS. 22 and 23 are cross-sectional views respectively showing characteristic first and second steps of a manufacturing process of the semiconductor device shown in FIG. 21.
Figure 23:
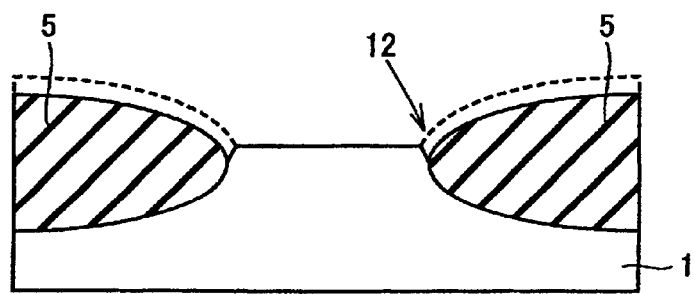
Figure 25B:
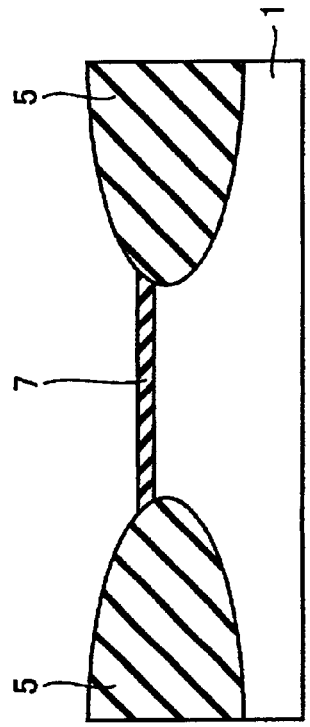
FIGS. 25A, 25B and 26A, 26B are cross-sectional views respectively showing characteristic first and second steps of a manufacturing process of a semiconductor device shown in FIGS. 24A and 24B.
Figure 25A:
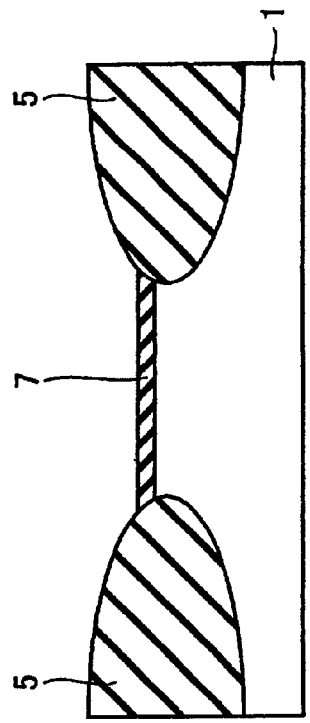
Figure 26A:
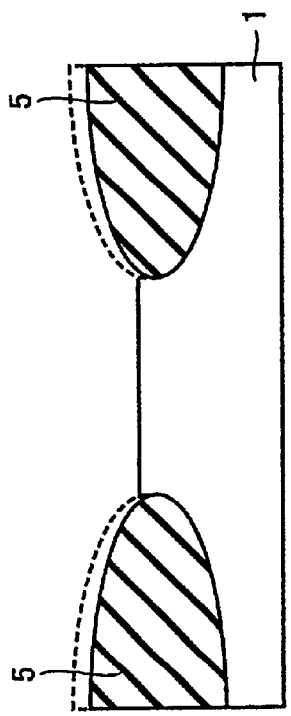
Figure 26B:
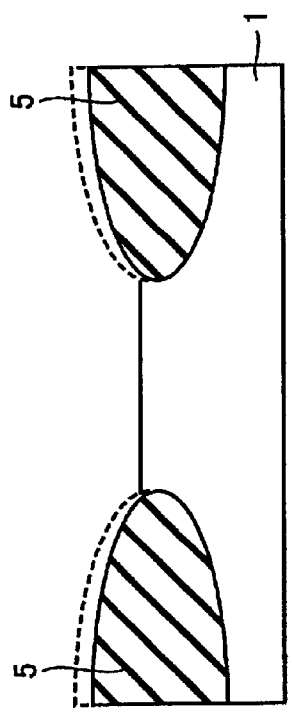

Then, the resist pattern 4 is removed, and selective oxidation is conducted using the buffer film 2 and the nitride film 3 as a mask, so that the bird's beak portion 6 is connected on the active region of the access MOS transistor formation portion. Thereafter, an oxide film is deposited and polished by the CMP method or the like. Thus, the trenches 10 can be filled with the oxide film, as shown in FIGS. 20A and 20B. The subsequent steps are the same as those of the second embodiment, whereby the structure shown in FIGS. 18A and 18B is obtained.

According to a semiconductor device of the present invention, a recessed portion as in the conventional example can be prevented from being produced at the edge of the isolation region, whereby the leak current can be suppressed. Thus, reliability of the semiconductor device can be improved.

According to a method for manufacturing a semiconductor device according to one aspect of the present invention, a recessed portion can be prevented from being produced at the edge of the isolation region by merely connecting the bird's beak portion on the active region. Therefore, reliability of the semiconductor device can be improved without requiring any additional step.

According to a method for manufacturing a semiconductor device according to another aspect of the present invention, the channel doping depth of the access MOS transistor can be made smaller than that of the driver MOS transistor by merely forming the bird's beak portion so as to cover the first active region, i.e., the active region of the access MOS transistor. Therefore, the memory cell performance of the SRAM can be improved without requiring any additional step.

By leaving such a bird's beak portion so as to cover the first active region, the thickness of the gate insulating film of the access MOS transistor can be made larger than that of the gate insulating film of the driver MOS transistor without requiring any additional step. Therefore, the memory cell operation of the SRAM can be stabilized without requiring any additional step.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor device, comprising an SRAM (Static Random Access Memory) including:
    a semiconductor substrate;
    an access MOS (Metal Oxide Semiconductor) transistor formed on an active region bounded by an isolation region, wherein an entire surface of the active region is rounded so as to be inclined downward toward said isolation region; and
    a driver MOS transistor.

2. The semiconductor device according to claim 1, wherein an isolation insulating film is formed in said isolation region,
    said isolation insulating film includes a bird's beak portion extending on said active region, and
    said active region is covered with said bird's beak portion.

3. The semiconductor device according to claim 2, wherein said bird's beak portion has a larger thickness near said isolation region than in a center of said active region.

4. The semiconductor device according to claim 1, wherein said access MOS transistor has a smaller channel doping depth than that of said driver MOS transistor.

5. The semiconductor device according to claim 1, wherein a gate insulating film of said driver MOS transistor has a larger thickness than that of a gate insulating film of said driver MOS transistor.

* * * * *